(12) United States Patent
Choung et al.

(10) Patent No.: US 8,889,032 B2
(45) Date of Patent: Nov. 18, 2014

(54) METAL WIRE ETCHANT AND METHOD OF FORMING METAL WIRE USING THE SAME

(71) Applicant: Samsung Display Co., Ltd., Yongin (KR)

(72) Inventors: Jong-Hyun Choung, Hwaseong-si (KR); In-Bae Kim, Yongin-si (KR); Seon-Il Kim, Seoul (KR); Hong Sick Park, Suwon-si (KR); Jae Woo Jeong, Incheon (KR); Gyu-Po Kim, Hwaseong-si (KR); Won-Guk Seo, Suwon-si (KR); Hyun-Cheol Shin, Hwaseong-si (KR); Ki-Beom Lee, Seoul (KR); Sam-Young Cho, Anyang-si (KR); Seung-Yeon Han, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/728,463

(22) Filed: Dec. 27, 2012

(65) Prior Publication Data

US 2014/0011352 A1    Jan. 9, 2014

(30) Foreign Application Priority Data

Jul. 3, 2012    (KR) .................. 10-2012-0072295

(51) Int. Cl.
| | |
|---|---|
| *C09K 13/04* | (2006.01) |
| *H01L 21/48* | (2006.01) |
| *C23F 1/26* | (2006.01) |
| *C23F 1/18* | (2006.01) |

(52) U.S. Cl.
CPC .............. *C23F 1/18* (2013.01); *H01L 21/4814* (2013.01); *C23F 1/26* (2013.01)
USPC .................. 252/79.4; 252/79.1; 252/79.3

(58) Field of Classification Search
CPC .......... C09K 13/00; C09K 13/08; C23F 1/18; C23F 1/26; C23F 11/149; C23F 1/14; C23F 1/20; C23F 1/34; H01L 21/32134; H05K 2203/124; H05K 3/383; H05K 3/067
See application file for complete search history.

(56) References Cited

U.S. PATENT DOCUMENTS

| | | | |
|---|---|---|---|
| 6,168,725 B1 | 1/2001 | Achari et al. | |
| 6,367,486 B1 | 4/2002 | Lee et al. | |

(Continued)

FOREIGN PATENT DOCUMENTS

| | | |
|---|---|---|
| JP | 2004-256901 | 9/2004 |
| JP | 2005-068524 | 3/2005 |

(Continued)

OTHER PUBLICATIONS

Masamitsu, Watanabe, et al., "Copper Corrosion Caused by Ammonium Sulfate and Sodium Sulfate Particles," Corrosion Engineering, vol. 51, No. 2, pp. 60-66, Japan.

GE Power & Water, Water & Process Technologies, Chapter 27 Chlorine & Chlorine Alternatives.

(Continued)

*Primary Examiner* — Lan Vinh
*Assistant Examiner* — Jiong-Ping Lu
(74) *Attorney, Agent, or Firm* — H.C. Park & Associates, PLC

(57) ABSTRACT

A metal wire etchant including persulfate, a sulfonate, a fluorine compound, an azole-based compound, an organic acid, a nitrate, and a chlorine compound, and a method of making the same.

15 Claims, 6 Drawing Sheets

(56) References Cited

U.S. PATENT DOCUMENTS

| | | | |
|---|---|---|---|
| 7,582,217 B2 | 9/2009 | Lee et al. | |
| 2006/0199394 A1 | 9/2006 | Takahashi et al. | |
| 2007/0235685 A1* | 10/2007 | Seki et al. | 252/79.2 |
| 2008/0224092 A1* | 9/2008 | Choung et al. | 252/79.3 |
| 2010/0291722 A1* | 11/2010 | Kim et al. | 438/38 |
| 2013/0034923 A1 | 2/2013 | Kim et al. | |

FOREIGN PATENT DOCUMENTS

| | | |
|---|---|---|
| JP | 2011-168834 | 9/2011 |
| KR | 10-2008-0069444 | 7/2008 |
| KR | 10-2010-0040004 | 4/2010 |
| KR | 10-2011-0026050 | 3/2011 |
| KR | 10-2011-0058924 | 6/2011 |
| KR | 10-2011-0083689 | 7/2011 |
| KR | 10-2013-0015943 | 2/2013 |
| WO | 2010/062508 | 6/2010 |

OTHER PUBLICATIONS

Pelech, Robert, et al., "Adsorption dynamics of chlorinated hydrocarbons from multi-component aqueous solution onto activated carbon," Institute of Chemical Organic Technology, Oct. 11, 2006, Szczecin, Poland.

Bembnowska, Anna, et al., "Adsorption from aqueous solutions of chlorinated organic compounds onto activated carbons," Journal of Colloid and Interface Science, Technical University of Szczecin, Mar. 5, 2003, Szczecin, Poland.

Yadav, M, et al., "Inhibition of corrosion of copper by 2.5-dimercapto-1,3,4-thiadiazole in 3.5% NaCl solution," Indian Journal of Chemical Technology, vol. 17, Mar. 2010, pp. 95-101, Dhanbad, India.

Malik, Anees U, et al., "Studies on the Role of Sulfamic Acid as a Descalant in Desalination Plants," Chemistry Lab, Al-Jubail Desalination Plant, pp. 1001-1023.

"Methane Sulfonic Acid (MSA) an Ideal Catalyst for Esterification," Thiochemicals Divisions, ARKEMA, pp. 1-14.

* cited by examiner

METAL WIRE ETCHANT AND METHOD OF FORMING METAL WIRE USING THE SAME

CROSS-REFERENCE TO RELATED APPLICATION

This application claims priority to and the benefit of Korean Patent Application No. 10-2012-0072295, filed on Jul. 3, 2012, which is hereby incorporated by reference for all purposes as if fully set forth herein.

BACKGROUND OF THE INVENTION

1. Field

Exemplary embodiments of the present invention relate to a metal wire etchant and a method of forming a metal wire using the same.

2. Description of the Background

In general, a thin film transistor (TFT) array panel may be used as a circuit board for independently driving each pixel in a liquid crystal display, an organic electroluminescence (EL) display device, or the like. The thin film transistor array panel may be formed of a gate wire transferring a scanning signal and a data wire transferring an image signal, and may be constituted by a thin film transistor connected to the gate wire and the data wire, a pixel electrode connected to the thin film transistor, and the like.

The thin film transistor may be constituted by a gate electrode that is a portion of the gate wire, a semiconductor layer forming a channel, and a source electrode and a drain electrode that are portions of the data wire. The thin film transistor may be a switching element either transferring a data voltage transferred through the data wire to the pixel electrode or interrupting the data voltage according to the gate signal transferred through the gate wire.

When the thin film transistor is manufactured, first, a metal layer is laminated on a substrate with a wire material for gate or source/drain electrodes, and an etching process of implementing a desired line path of an electric circuit by corroding the metal layer by gas or a solution having a corrosion property follows.

A circuit line becomes thinner as the circuit is reduced in size and integrated, thereby providing a relative increase in electrical resistance. Therefore, copper is receiving attention as a wire material having low resistance as a possible replacement for chromium, molybdenum, aluminum, and an alloy thereof, which are mainly used as known circuit line materials.

However, because copper has relatively poor adherence to a glass substrate or a silicon insulating layer, it is difficult to use as a single layer, and accordingly, a multilayer employing copper and a metal layer having excellent adherence to the glass substrate or the silicon insulating layer as a lower layer may be used.

A peroxide-based etchant may be used to etch the multilayer, and because the peroxide-based etchant rapidly decomposes into water and oxygen by promoting decomposition of peroxides, if a metal ion has at least a predetermined concentration, heat emission and a rapid composition change may occur, thereby reducing stability. A method of adding a peroxide stabilizer has been used in order to solve the problems of hydrogen peroxides, but the high price of the stabilizer increases cost.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide an excellent metal wire etchant that can ensure high stability and a high process margin, can uniformly etch a copper layer and a lower metal layer, and a method of forming a metal wire using the same.

Additional features of the invention will be set forth in the description which follows, and in part will be apparent from the description, or may be learned by practice of the invention.

An exemplary embodiment of the present invention discloses a metal wire etchant including: persulfate, sulfonate, a fluorine compound, an azole-based compound, organic acid, nitrate, and a chlorine compound.

An exemplary embodiment of the present invention also discloses a method of forming a metal wire, including: forming at least one of a single layer comprising copper, a copper alloy layer, and a multilayer comprising at least one of a titanium layer (Ti), an indium tin oxide layer (ITO), an indium gallium zinc oxide layer (IGZO), an indium zinc oxide layer (IZO), and zinc aluminum oxide (ZAO) as a lower layer and copper or a copper alloy layer as an upper layer on a substrate; and etching any one of the single layer, the copper alloy layer and the multilayer with an etchant. The etchant may include persulfate, sulfonate, a fluorine compound, an azole-based compound, organic acid, nitrate, and a chlorine compound.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
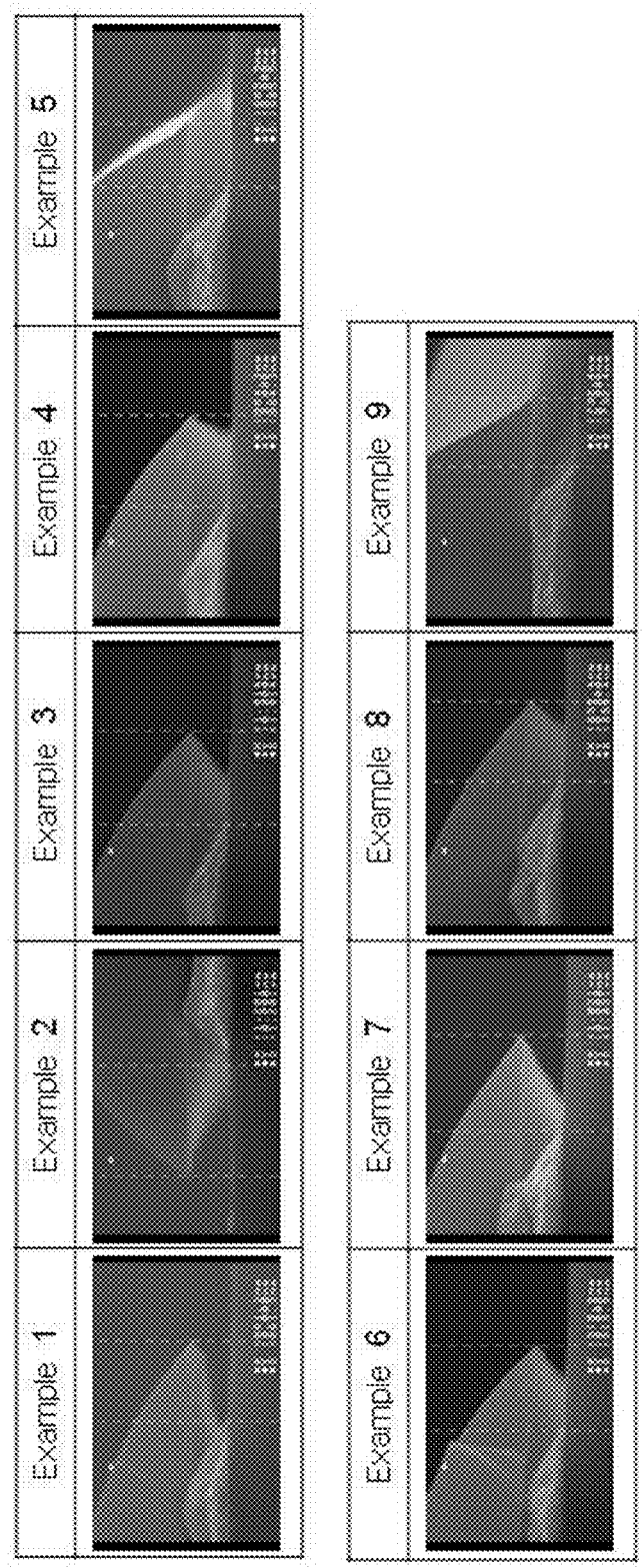
FIG. 1 includes electron micrographs illustrating a lateral surface of a copper layer obtained by etching a titanium/copper double layer using etchants of Examples 1 to 9, according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

It will be understood that when an element such as a layer, film, region, or substrate is referred to as being "on" or "connected to" another element, it can be directly on or directly connected to the other element, or intervening elements may also be present. In contrast, when an element is referred to as being "directly on" or "directly connected to" another element, there are no intervening elements present. It will be understood that for purposes of this disclosure, "at least one of X, Y, and Z" can be construed as X only, Y only, Z only, or any combination of two or more items X, Y, and Z (e.g., XYZ, XYY, YZ, ZZ).

The metal wire etchant according to an exemplary embodiment of the present invention includes persulfate, sulfonate, a fluorine compound, an azole-based compound, organic acid, nitrate, a chlorine compound, and a remainder of water.

Persulfate is an oxidant and a main component for etching a copper layer, and etches the copper layer by a reaction represented by the following Reaction Equation 1, to form a stable compound.

$$S_2O_8^{-2} + 2Cu \rightarrow 2CuSO_4 \qquad \text{Reaction Equation 1}$$

The persulfate may be any persulfate having a sufficient purity for a semiconductor process. In the etchant, the content of persulfate may be in a range of 5 wt % to 15 wt % based on the total weight of the etchant. If persulfate is included in an amount of less than 5 wt %, the copper layer is very slowly etched. If persulfate is included in an amount of more than 15 wt %, an etch rate of the copper layer is excessively high, thus reducing a processing margin. Further, waste water can produce severe latent heat emission and, accordingly, cooling water may be added to a collector of the waste water, resulting in an additional process cost.

The persulfate may include diammonium persulfate $((NH_4)_2S_2O_8)$, sodium persulfate $(Na_2S_2O_8)$, or potassium persulfate $(K_2S_2O_8)$.

The sulfonate is an auxiliary oxidant for etching the copper layer, increases an etch rate of copper, and also serves as a chelating agent for copper ions eluted during the copper etching process, in order to prevent a reduction in etching rate. The type of sulfonate is not particularly limited, and representative examples thereof include methanesulfonic acid $(CH_3SOH)$, para-toluenesulfonic acid $(CH_3C_6H_4SO_3H)$, benzenesulfonic acid $(C_6H_5SO_3H)$, and the like. According to some embodiments, methanesulfonic acid $(CH_3SOH)$ and para-toluenesulfonic acid $(CH_3C_6H_4SO_3H)$ may be used together.

The methanesulfonic acid $(CH_3SOH)$ may increase the etch rate of copper and remove photoresist residues that may be formed during a lithography process. However, since the methanesulfonic acid alone may not be sufficient to properly chelate the eluted copper ions, exemplary embodiments of the present invention may also include para-toluenesulfonic acid (CH3C6H4SO3H) together with methanesulfonic acid (CH3SOH), to chelate the copper ions and prevent a reduction in the etch rate, thus ensuring a process margin.

The sulfonate may be any sulfonate having a sufficient purity for a semiconductor process. In the etchant, the content of the methanesulfonic acid $(CH_3SOH)$ may be in a range of 1 wt % to 10 wt %, based on the total weight of the sulfonate. If the content of the methanesulfonic acid $(CH_3SOH)$ is less than 0.1 wt %, the methanesulfonic acid may not serve as an auxiliary oxidant. If the content of the methanesulfonic acid is greater than 10 wt %, the etch rate of the copper layer may be excessively high, causing short-circuit defects in the wire. The content of the para-toluenesulfonic acid $(CH_3C_6H_4SO_3H)$ may be in a range of 0.1 wt % to 10 wt %, based on the total weight of sulfonate. If the content of the para-toluenesulfonic acid $(CH_3C_6H_4SO_3H)$ is less than 0.1 wt %, the para-toluenesulfonic acid may not serve as a chelating agent. If the content of the para-toluenesulfonic acid is greater than 10 wt %, the para-toluenesulfonic acid may be adsorbed onto the surface of the copper layer, thereby generating a residual material when etching is performed. Thus, staining defects may occur.

The fluorine compound is a main component for etching the lower layer of the multilayer metal wire. The type of flourine compound is not particularly limited. For example, the fluorine compound may include hydrogen fluoride (HF), sodium fluoride (NaF), sodium bifluoride $(NaHF_2)$, ammonium fluoride $(NH_4F, NH_4HF_2)$, ammonium fluoborate $(NH_4BF_4)$, potassium fluoride (KF), potassium bifluoride $(KHF_2)$, aluminum fluoride $(AlF_3)$, fluoroboric acid $(HBF_4)$, lithium fluoride (LiF), potassium fluoborate $(KBF_4)$, calcium fluoride $(CaF_2)$, and the like.

The content of the fluorine compound may be in a range of 0.01 wt % to 1 wt %, based on the total weight of the etchant. If the content of the fluorine compound is less than 0.01 wt %, it may be difficult to etch the lower layer. If the content of the fluorine compound is more than 1 wt %, defects may be formed in the glass substrate and the insulating layer.

The azole-based compound refers to a 5-membered heterocyclic compound including nitrogen and at least one non-carbon atom therein. Although not particularly limited, examples of the azole-based compound may include benzotriazole, aminotetrazole, aminotetrazole of potassium salt, imidazole, pyrazole, and the like.

The content of the azole-based compound may be in a range of 0.1 wt % to 2 wt %, based on the total weight of the etchant. The azole-based compound serves to suppress etching of the copper layer, to control the etch rate between metals in the multilayer of copper and another metal, and serves to reduce a cut dimension loss (CD loss) of the wire, so the metal wire may be used as gate and data wires.

If the content of the azole-based compound is less than 0.1 wt %, the etch rate to copper may not be controlled, the CD loss may be increased, and the linearity of the wire may be reduced, causing a serious problem when the azole-based compound is applied to a mass production process. If the content is more than 2 wt %, waste water heat emission is promoted, thereby increasing a process cost during treatment of waste water.

The organic acid is a compound including a carboxyl group and is not particularly limited. For example, the organic acid may be at least one selected from the group consisting of oxalic acid, oxalacetic acid, fumaric acid, malic acid, succinic acid, acetic acid, butyric acid, palmitic acid, tartaric acid, ascorbic acid, uric acid, sulfonic acid, sulfinic acid, tartaric acid, formic acid, citric acid, isocitric acid, alpha-ketoglutaric acid, succinic acid, and glycolic acid.

The content of the organic acid may be in a range of 5 wt % to 15 wt %, based on the total weight of the etchant. The organic acid serves to maintain a taper angle according to the copper ions when the copper layer is etched to show an effect of suppressing step coverage defects during the process.

The nitrate may be a compound that may be dissociated into $NO_3^-$, and a salt compound having a characteristic that is different from that of nitric acid. Nitric acid excessively promotes etching of the copper layer, making it difficult to control etching, and promotes decomposition of persulfate, resulting in many limitations in use. On the contrary, nitrate does not cause the aforementioned problems, and may prevent generation of photoresist residues that may be generated during a lithography process. In the exemplary embodiment of the present invention, examples of nitrate may include at least one selected from the group consisting of ammonium nitrate ($NH_4NO_3$), sodium nitrate ($NaNO_3$), potassium nitrate ($KNO_3$), and lithium nitrate ($LiNO_3$).

In the exemplary embodiment of the present invention, the content of nitrate may be in a range of 1 wt % to 5 wt % based on the total weight of the etchant. If the content of nitrate is less than 1 wt %, a residue removing ability is reduced, and if nitrate is added in a content of more than 5 wt %, the same effect is obtained, but the manufacturing cost is increased.

The chlorine compound of the present invention is a compound other than hydrochloric acid (HCl), which may be dissociated into $Cl^-$, and has very excellent adsorption ability to copper and thus serves to prevent a phenomenon in which partial acidification is increased as a result of the exhaustion of dissolved oxygen and an increase in hydrogen ions at the lower portion of the photoresist, during the etching process. this may result in an increase of the partial etch rate, causing over-erosion. Examples of the chlorine compound may include at least one selected from the group consisting of ammonium chloride (NH4Cl), potassium chloride (KCl), sodium chloride (NaCl), and lithium chloride (LiCl).

In the exemplary embodiment of the present invention, the content of the chlorine compound may be in a range of 0.001 wt % to 0.1 wt % based on the total weight of the etchant. If the content of the chlorine compound is less than 0.001 wt %, a short circuit of the wire caused by over-erosion may not be prevented, and if the content is more than 0.1 wt %, adsorption of the copper layer becomes very great, and thus the number of cumulative treatments is reduced to reduce a process margin.

In the exemplary embodiment of the present invention, although specified herein, the content of water may be the balance to the total wt % of the components other than water, based on 100 wt % of the entire etchant. Water having a semiconductor level purity or ultrapure water may be used as water.

In the range of the etchant or etchant composition disclosed in the present invention, the etchant that is included in the range of the weight ratio as described above is included. However, even though the composition is outside the weight ratio range or there are substitutions of some components described above as an example, if it is obvious to those who are skilled in the art that the modified constitution is substantially the same as the etchant composition, this constitution is also included therein.

Hereinafter, the present invention will be described in more detail with reference to Examples and Comparative Examples. The following constitutions described in the Examples and the Comparative Examples are provided for better understanding of the present invention, but the technical scope of the present invention is not limited to the Examples.

EXAMPLE AND COMPARATIVE EXAMPLE

The etchants of Examples 1 to 9 and Comparative Examples 1 to 7 according to the etchant composition of the present invention were manufactured as described in the following Table 1, and etching performances thereof were compared in the following Table 2. The compositions of Examples 1 to 9 and Comparative Examples 1 to 7 are described in Table 1, and all values thereof are based on the weight ratio.

TABLE 1

| | Persulfate | Sulfonate | | Fluorine compound | Azole-based compound | Organic acid | Nitrate | Chlorine compound |
|---|---|---|---|---|---|---|---|---|
| | APS | MSA | PTSA | HF | ATZ | AcOH | AN | AC |
| Example | | | | | | | | |
| Example 1 | 10 | 3 | 3 | 0.5 | 1 | 10 | 3 | 0.005 |
| Example 2 | 3 | 3 | 3 | 0.5 | 1 | 10 | 3 | 0.005 |
| Example 3 (J06) | 10 | 3 | 5 | 0.5 | 1 | 10 | 3 | 0.005 |
| Example 4 | 10 | 3 | 7 | 0.5 | 1 | 10 | 3 | 0.005 |
| Example 5 | 10 | 3 | 5 | 0.5 | 2 | 10 | 3 | 0.005 |
| Example 6 | 10 | 3 | 5 | 0.5 | 1 | 5 | 3 | 0.005 |
| Example 7 | 10 | 3 | 5 | 0.5 | 1 | 15 | 3 | 0.005 |
| Example 8 | 10 | 3 | 5 | 0.5 | 1 | 10 | 6 | 0.005 |
| Example 9 | 10 | 3 | 5 | 0.5 | 1 | 10 | 3 | 0.005 |
| Comparative Example | | | | | | | | |
| Comparative Example 1 | 20 | 3 | 3 | 0.5 | 1 | 10 | 3 | 0.005 |
| Comparative Example 2 | 3 | 0 | 3 | 0.5 | 1 | 10 | 3 | 0.005 |
| Comparative Example 3 | 10 | 3 | 0 | 0.5 | 1 | 10 | 3 | 0.005 |
| Comparative Example 4 | 10 | 3 | 5 | 0.5 | 3 | 10 | 3 | 0.005 |
| Comparative Example 5 | 10 | 3 | 5 | 0.5 | 1 | 0 | 3 | 0.005 |
| Comparative Example 6 | 10 | 3 | 5 | 0.5 | 1 | 10 | 0 | 0.005 |
| Comparative Example 7 | 10 | 3 | 5 | 0.5 | 1 | 10 | 3 | 0 |

Specifically, the multilayer of the titanium layer/copper layer was contaminated by copper at 1000 ppm/hour and titanium at 100 ppm/hour and subjected to the overetching experiment for 90 sec, to measure the etch rate of the etchant of each Example, and the cross-section of the etched copper layer was measured by using a scanning electron microscope to evaluate the CD skew and the taper angle.

Figure 2:
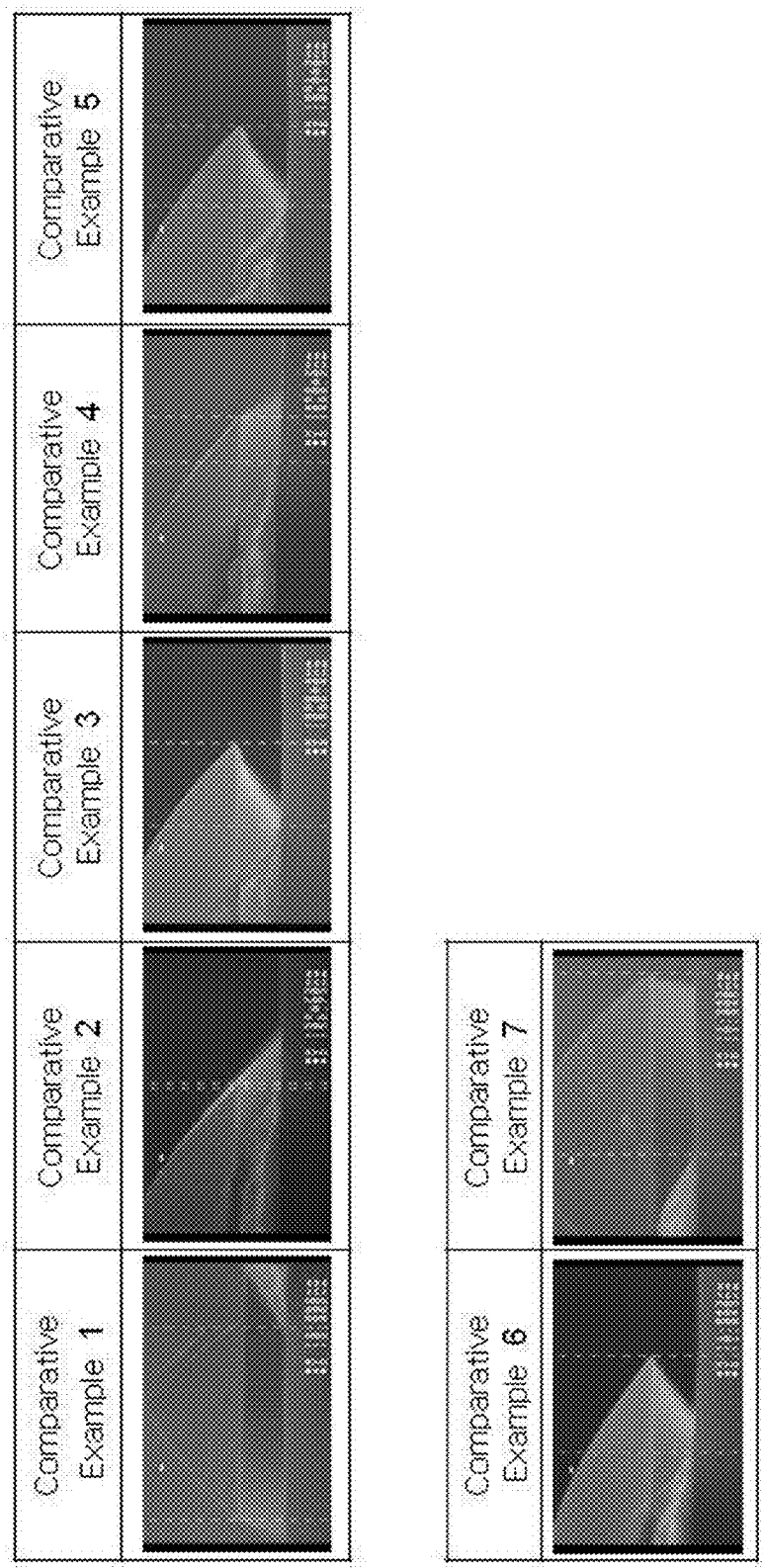
FIG. 2 includes electron micrographs illustrating a lateral surface of a copper layer obtained by etching a titanium/copper double layer using etchants of Comparative Examples 1 to 7.

FIG. 1 shows scanning electron micrographs illustrating a lateral surface of a copper layer obtained by etching a titanium/copper double layer using etchants of Examples 1 to 9 of the present invention, and FIG. 2 shows micrographs illustrating a lateral surface of a copper layer obtained by etching a titanium/copper double layer by etchants of Comparative Examples 1 to 7.

Figure 3:
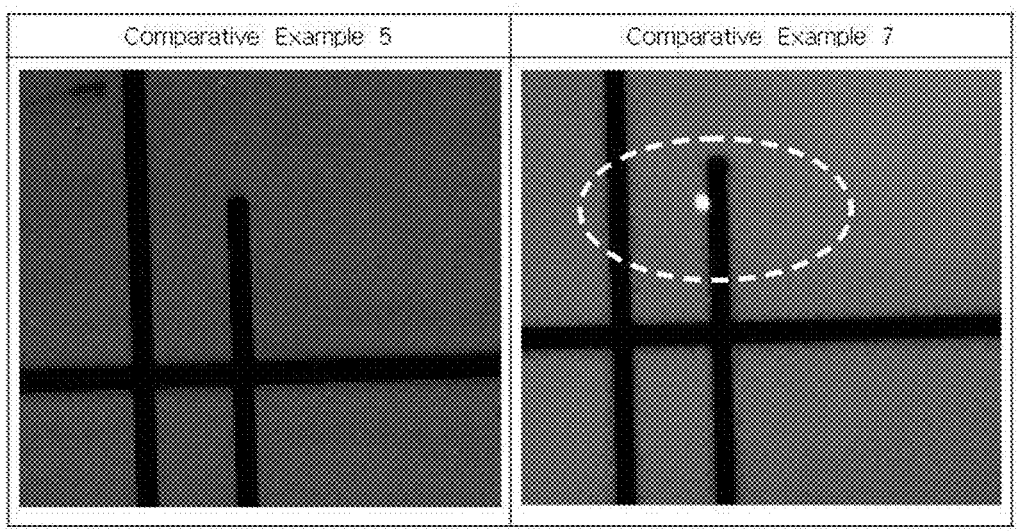
FIG. 3 includes electron micrographs taken after only copper of a molybdenum/titanium/copper multilayer is etched by the etchants of Comparative Examples and 7.

After only copper in the multilayer of the molybdenum titanium/copper layer was etched, the number of holes formed in the molybdenum titanium layer generated by partial overetching of copper was measured by using the microscope, in order to evaluate the effect of erosion, and examples of the cases of Comparative Examples 5 and 7 are shown in FIG. 3. The case of Comparative Example 5 is the composition including the chlorine compound, and the case of Comparative Example 7 is the composition excluding the chlorine compound.

Figure 4:
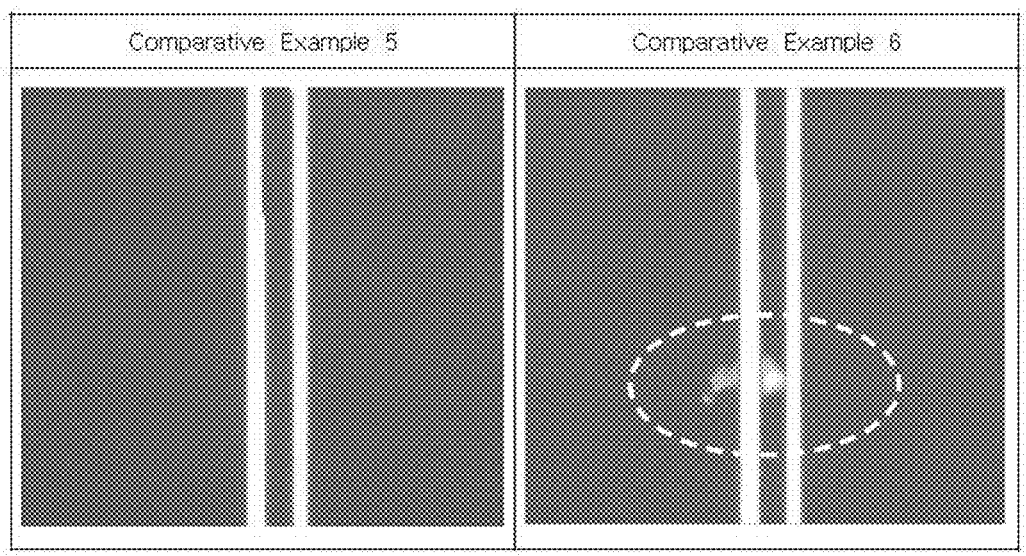
FIG. 4 includes electron micrographs taken after a titanium/copper multilayer is etched by the etchants of Comparative Examples 5 and 6.

After 30% overetching was performed, based on the time taken to completely etch titanium, the remaining copper layer or titanium layer was measured by using the microscope, in order to evaluate the residue effect, and the examples of residue occurrence of Comparative Examples 5 and 6 are shown in FIG. 4. The case of Comparative Example 5 is the composition including nitrate, and the case of Comparative Example 6 is the composition excluding nitrate.

The etchant was heated to 70° C. and was forcibly contaminated by 3000 ppm of copper and 300 ppm of titanium, and the highest heat emission points obtained in waste water were measured and compared in order to evaluate the heat emission effect. The evaluation results of etching characteristics including heat emission are described in Table 2.

TABLE 2

| | Cu Etch Rate | Lateral side CD Skew | Cumulative number | New solution taper | Taper in contamination by 5000 ppm of copper | New solution erosion number | Erosion in contamination by 5000 ppm of copper | New solution residue number | Residue in contamination by 5000 ppm of copper | Heat emission in contamination by 3000 ppm of copper |
|---|---|---|---|---|---|---|---|---|---|---|
| Example | | | | | | | | | | |
| Example 1 | 167 Å/sec | 0.9 μm | 3000 ppm | 38° | 40° | 0 | 0 | 1 | 2 | 6.5° C. |
| Example 2 | 192 Å/sec | 1.2 μm | 4000 ppm | 35° | 38° | 0 | 0 | 1 | 2 | 25.4° C. |
| Example 3 | 172 Å/sec | 1 μm | 4000 ppm | 37° | 38° | 0 | 0 | 1 | 2 | 7.1° C. |
| Example 4 | 179 Å/sec | 1 μm | 5000 ppm | 39° | 41° | 0 | 0 | 1 | 4 | 6.8° C. |
| Example 5 | 139 Å/sec | 0.7 μm | 3000 ppm | 41° | 42° | 0 | 0 | 2 | 3 | 13.4° C. |
| Example 6 | 167 Å/sec | 0.9 μm | 4000 ppm | 38° | 45° | 0 | 0 | 1 | 2 | 6.5° C. |
| Example 7 | 161 Å/sec | 1 μm | 4000 ppm | 39° | 41° | 0 | 0 | 1 | 2 | 6.3° C. |
| Example 8 | 152 Å/sec | 0.9 μm | 4000 ppm | 38° | 39° | 0 | 0 | 1 | 1 | 6.1° C. |
| Example 9 | 161 Å/sec | 0.7 μm | 3000 ppm | 43° | 45° | 0 | 0 | 2 | 3 | 6.7° C. |
| Comparative Example | | | | | | | | | | |
| Comparative Example 1 | 227 Å/sec | 2.0 μm | 4000 ppm | 35° | 35° | 0 | 0 | 1 | 2 | 48.3° C. |
| Comparative Example 2 | 63 Å/sec | 0.1 μm | 2000 ppm | 39° | 41° | 0 | 0 | 2 | 15 | 6.5° C. |
| Comparative Example 3 | 161 Å/sec | 0.9 μm | 1000 ppm | 40° | 38° | 0 | 0 | 1 | 21 | 7.1° C. |
| Comparative Example 4 | 125 Å/sec | 0.5 μm | 3000 ppm | 43° | 44° | 0 | 0 | 2 | 5 | 21.5° C. |
| Comparative Example 5 | 167 Å/sec | 0.9 μm | 4000 ppm | 38° | 58° | 0 | 0 | 2 | 3 | 6.8° C. |
| Comparative Example 6 | 172 Å/sec | 1.0 μm | 4000 ppm | 39° | 41° | 0 | 0 | 4 | 12 | 7.2° C. |
| Comparative Example 7 | 200 Å/sec | 1.8 μm | 4000 ppm | 28° | 31° | 100 | 100 | 1 | 2 | 6.9° C. |

The CD skew (cut dimension skew) represents a distance between an end of a photoresist and an end of copper, and the distance should be within an appropriate range in order not to cause a step portion and to ensure uniform taper etching. The taper angle is an angle viewed from a lateral surface of the etched metal layer, and an appropriate value thereof is about 35° to 45°.

As seen in Table 2, it can be seen that the etchants according to the Examples of the present invention exhibit an excellent etch rate and CD skew and allow the taper profile to be controlled to 35° to 45°. On the other hand, in Comparative Example 1, the content of persulfate is 20 wt %, and an excessively high heat emission characteristic is shown. In Comparative Example 2, because the methanesulfonic acid (MSA) controlling the etch rate is excluded therefrom, the etch rate of copper is very low, and the cumulative number is also low. In Comparative Example 3, because the para-toluenesulfonic acid (PTSA) serving as the chelating agent is excluded therefrom, the lowest cumulative number of 1000 ppm was exhibited. In Comparative Example 4, because the content of 5-aminotetrazole serving as a corrosion prevention agent was high, heat emission was increased and the residue was likely to be increased. In Comparative Example 5, the organic acid, such as acetic acid, was excluded therefrom, so that when accumulation was increased, defects of an increase in taper angle occurred, and in Comparative Example 6, nitrate was excluded, resulting in an increase in residue. In Comparative Example 7, the chlorine compound was excluded therefrom, which resulted in the detection of 100 erosion defects or more.

Other etchants according to the Examples of the present invention were manufactured as in Examples 10 to 14 shown in Table 3, and etching performances thereof were compared. In Examples 1 to 9, the persulfate, nitrate, and chlorine compound were the compound including ammonium salts, but in Examples 10 to 14, the experiment was performed after the persulfate, nitrate, and chlorine compound were changed to the compound including sodium salts instead of ammonium salts. The compositions of Examples 10 to 14 are described in Table 3, and all values thereof have a wt % unit.

TABLE 3

| Example | Persulfate SPS | Sulfonate MSA | Sulfonate PTSA | Fluorine compound HF | Azole-based compound ATZ | Organic acid AcOH | Nitrate SN | Chlorine compound SC |
|---|---|---|---|---|---|---|---|---|
| Example 10 | 10 | 3 | 3 | 0.5 | 1 | 10 | 3 | 0.005 |
| Example 11 | 10 | 3 | 5 | 0.5 | 1 | 10 | 3 | 0.005 |
| Example 12 | 10 | 3 | 7 | 0.5 | 1 | 10 | 3 | 0.005 |
| Example 13 | 10 | 3 | 5 | 0.5 | 1 | 10 | 3 | 0.005 |
| Example 14 | 15 | 3 | 5 | 0.5 | 1 | 10 | 3 | 0.005 |

Figure 5:
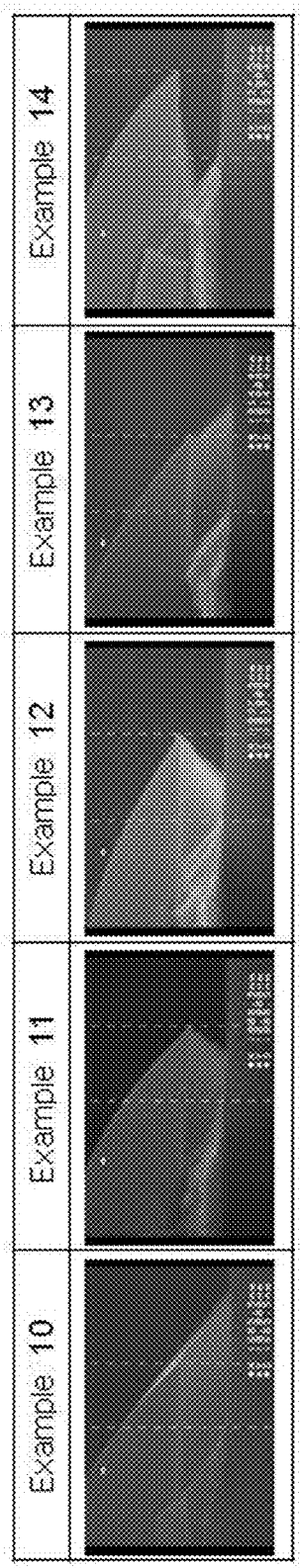
FIG. 5 includes electron micrographs illustrating the lateral surface of the copper layer obtained by etching the titanium/copper multilayer by the etchants of Examples 10 to 14.

The etch rates of the etchants of Examples 10 to 14 were measured by using the same method as the evaluation method of Table 2. FIG. 5 shows pictures obtained by measuring the CD skew and the taper angle by measuring the cross-section of the etched copper layer by using the scanning electron microscope, and the etching characteristic evaluation results of Examples 10 to 14 are described in Table 4.

TABLE 4

| Example | Cu Etch Rate | Lateral side CD Skew | Cumulative number | New solution taper | Taper in contamination by 5000 ppm of copper | New solution erosion number | Erosion in contamination by 5000 ppm of copper | New solution residue number | Residue in contamination by 5000 ppm of copper | Heat emission in contamination by 3000 ppm of copper |
|---|---|---|---|---|---|---|---|---|---|---|
| Example 10 | 128 Å/sec | 0.7 μm | 3000 ppm | 39° | 41° | 0 | 0 | 1 | 2 | 6.3° C. |
| Example 11 | 135 Å/sec | 0.8 μm | 4000 ppm | 37° | 36° | 0 | 0 | 1 | 2 | 24.8° C. |
| Example 12 | 143 Å/sec | 0.9 μm | 5000 ppm | 38° | 41° | 0 | 0 | 1 | 3 | 6.8° C. |
| Example 13 | 139 Å/sec | 0.8 μm | 4000 ppm | 40° | 42° | 0 | 0 | 2 | 4 | 7.2° C. |
| Example 14 | 152 Å/sec | 0.9 μm | 3000 ppm | 36° | 39° | 0 | 0 | 1 | 2 | 6.5° C. |

In Table 4, Examples 10 to 14 had the characteristic of reduced etch rate as compared to Examples 1 to 9, and the remaining result data were similar to those of Table 2.

Further, the etchant according to Example 3 of the present invention was manufactured, and etching performance thereof to storage stability was examined. The storage stability test was performed at a low temperature of 10° C. for 7 days, and the treatment number was evaluated for 5 hours by performing contamination by copper powder at 1000 ppm/hour and titanium powder at 100 ppm/hour. Table 5 shows the evaluation result of storage stability.

As seen in Table 5, the etchants according to the Examples of the present invention have a benefit in that the initial performance can be maintained because the etch characteristic is not changed until 7 days of the initial storage at the low temperature.

As seen in Table 5, the etchants according to the Examples of the present invention have a benefit in that the initial performance can be maintained because the etch characteristic is not changed until the concentration of copper ions becomes 4000 ppm, even though a large number of multilayers of titanium layer/copper layer are etched.

Figure 6:
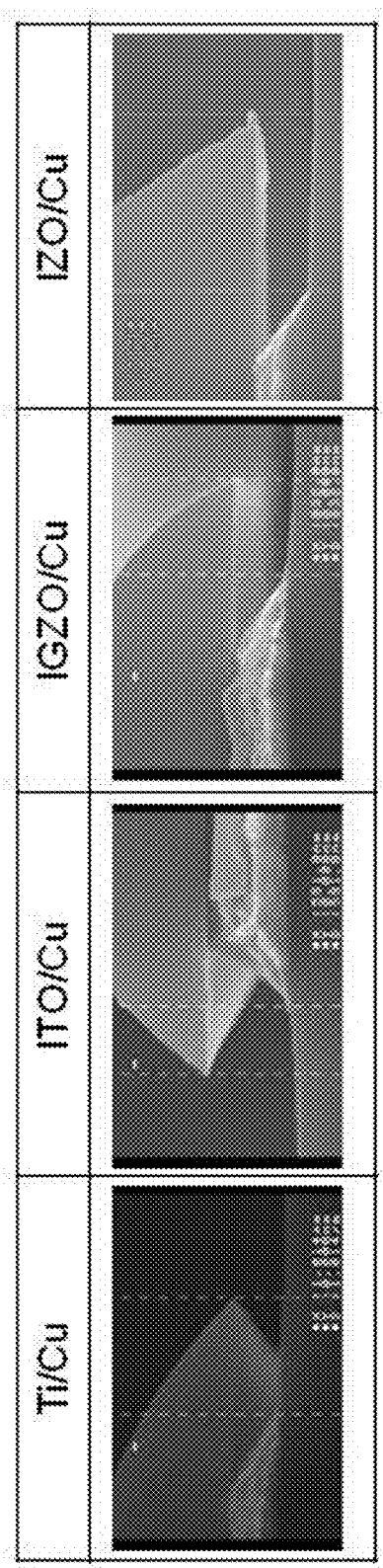
FIG. 6 includes electron micrographs illustrating the lateral surface of the copper layer obtained by etching titanium/copper, indium tin oxide/copper, indium gallium zinc oxide/copper, and indium zinc oxide/copper multilayers by the etchant of Example 3.

A method of forming a metal wire according to another exemplary embodiment of the present invention includes forming at least one of a single layer including copper, a copper alloy layer, and a multilayer including at least one of a titanium layer (Ti), an indium tin oxide layer (ITO), an indium gallium zinc oxide layer (IGZO), an indium zinc oxide layer (IZO), and zinc aluminum oxide (ZAO) as a lower layer, and copper or a copper alloy layer as an upper layer on a substrate, and etching any one of the single layer, the copper alloy layer, and the multilayer with an etchant. The aforementioned etchant according to Example 3 of the present invention may be used as the etchant, and an example thereof is shown in FIG. 6.

The single layer or the multilayer formed on the substrate may be formed as a gate line or a data line in a thin film

TABLE 5

| Day | Cu Etch Rate | Lateral side CD Skew | Cumulative number | New solution taper | Taper in contamination by 5000 ppm of copper | New solution erosion number | Erosion in contamination by 5000 ppm of copper | New solution residue number | Residue in contamination by 5000 ppm of copper | Heat emission in contamination by 3000 ppm of copper |
|---|---|---|---|---|---|---|---|---|---|---|
| 0 day | 172 Å/sec | 1.0 μm | 4000 ppm | 37° | 38° | 0 | 0 | 1 | 2 | 7.1° C. |
| 3 day | 168 Å/sec | 1.0 μm | 4000 ppm | 36° | 35° | 0 | 0 | 1 | 3 | 6.9° C. |
| 5 day | 170 Å/sec | 1.0 μm | 4000 ppm | 37° | 39° | 0 | 0 | 1 | 2 | 6.8° C. |
| 7 day | 165 Å/sec | 1.0 μm | 4000 ppm | 35° | 38° | 0 | 0 | 1 | 3 | 6.5° C. | transistor array panel and, more particularly, in the case where the gate line or the data line is formed of the multilayer of titanium layer/copper layer, simultaneous etching can be performed by using the etchant according to any one Example of the present invention. Herein, the titanium layer may be a lower layer, and the copper layer may be an upper layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A metal wire etchant comprising:
   a persulfate;
   a sulfonate;
   a fluorine-containing compound;
   an azole-based compound;
   an organic acid;
   a nitrate; and
   a chlorine compound at a content in a range of 0.001 wt % to 0.1 wt %, based on the total weight of the etchant, the chlorine compound comprising at least one selected from the group consisting of ammonium chloride ($NH_4Cl$), potassium chloride (KCl), sodium chloride (NaCl), and lithium chloride (LiCl).

2. The metal wire etchant of claim 1, wherein the content of the persulfate is in a range of 5 wt % to 15 wt %, based on the total weight of the etchant.

3. The metal wire etchant of claim 2, wherein:
   the persulfate is at least one selected from the group consisting of ammonium persulfate ($(NH_4)_2S_2O_8$), sodium persulfate ($Na_2S_2O_8$), and potassium persulfate ($K_2S_2O_8$).

4. The metal wire etchant of claim 1, wherein:
   a content of the sulfonate is in a range of 1 wt % to 10 wt %, based on the total weight of the etchant.

5. The metal wire etchant of claim 4, wherein:
   the sulfonate is at least one selected from the group consisting of methanesulfonic acid ($CH_3SOH$), para-toluenesulfonic acid ($CH_3C_6H_4SO_3H$), and benzenesulfonic acid ($C_6H_5SO_3H$).

6. The metal wire etchant of claim 1, wherein:
   a content of the fluorine compound is in a range of 0.01 wt % to 1 wt %, based on the total weight of the etchant.

7. The metal wire etchant of claim 6, wherein:
   the fluorine compound is at least one selected from the group consisting of hydrogen fluoride (HF), sodium fluoride (NaF), sodium bifluoride ($NaHF_2$), ammonium fluoride ($NH_4F$, $NH_4HF_2$), ammonium fluoborate ($NH_4BF_4$), potassium fluoride (KF), potassium bifluoride ($KHF_2$), aluminum fluoride ($AlF_3$), fluoroboric acid ($HBF_4$), lithium fluoride (LiF), potassium fluoborate ($KBF_4$), and calcium fluoride ($CaF_2$).

8. The metal wire etchant of claim 1, wherein:
   a content of the azole-based compound is in a range of 0.1 wt % to 2 wt %, based on the total weight of the etchant.

9. The metal wire etchant of claim 8, wherein:
   the azole-based compound is at least one selected from the group consisting of benzotriazole, aminotetrazole, aminotetrazole of potassium salt, imidazole, and pyrazole.

10. The metal wire etchant of claim 1, wherein:
    the content of the organic acid is in a range of 5 wt % to 15 wt %, based on the total weight of the etchant.

11. The metal wire etchant of claim 10, wherein:
    the organic acid is at least one selected from the group consisting of an oxalic acid, an oxalacetic acid, a fumaric acid, a malic acid, a succinic acid, an acetic acid, a butyric acid, a palmitic acid, a tartaric acid, an ascorbic acid, a uric acid, a tartaric acid, a formic acid, a citric acid, an isocitric acid, an alpha-ketoglutaric acid, and a glycolic acid.

12. The metal wire etchant of claim 1, wherein:
    the content of the nitrate is in a range of 1 wt % to 5 wt %, based on the total weight of the etchant.

13. The metal wire etchant of claim 12, wherein:
    the nitrate is at least one selected from the group consisting of ammonium nitrate ($NH_4NO_3$), sodium nitrate ($NaNO_3$), potassium nitrate ($KNO_3$), and lithium nitrate ($LiNO_3$).

14. The metal wire etchant of claim 1, wherein:
    the metal wire to which the metal wire etchant is applied is any one of a single layer comprising copper, a copper alloy layer, and a multilayer comprising at least one of a titanium layer (Ti), an indium tin oxide layer (ITO), an indium gallium zinc oxide layer (IGZO), an indium zinc oxide layer (IZO), and zinc aluminum oxide (ZAO) as a lower layer, and copper as an upper layer.

15. The metal wire etchant of claim 1, wherein:
    the content of the persulfate is in a range of 5 wt % to 15 wt %, based on the total weight of the etchant; the content of the sulfonate is in a range of 1 wt % to 10 wt %, based on the total weight of the etchant; the content of the fluorine compound is in a range of 0.01 wt % to 1 wt %, based on the total weight of the etchant; the content of the azole-based compound is in a range of 0.1 wt % to 2 wt %, based on the total weight of the etchant; a content of the organic acid is in a range of 5 wt % to 15 wt %, based on the total weight of the etchant; and the content of the nitrate is in a range of 1 wt % to 5 wt %, based on the total weight of the etchant.

* * * * *